United States Patent
Vasanth et al.

(10) Patent No.: US 6,274,449 B1
(45) Date of Patent: Aug. 14, 2001

(54) METHOD OF POCKET IMPLANT MODELING FOR A CMOS PROCESS

(75) Inventors: Karthik Vasanth, Dallas; Mahalingam Nandakumar, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/216,300

(22) Filed: Dec. 18, 1998

Related U.S. Application Data

(60) Provisional application No. 60/068,633, filed on Dec. 23, 1997.

(51) Int. Cl.[7] ................................................. H01L 21/331
(52) U.S. Cl. ............................. 438/305; 438/14; 438/17; 438/306; 438/307
(58) Field of Search .................................... 438/141, 171, 438/301, 305, 306, 307

(56) References Cited

PUBLICATIONS

K. Vasanth, et al., "A Pocket Implant . . . CMOS Process Flows", Dec. 05, 1996.*
1996 IEEE "An Efficient Method for Modeling the Effect of Implant Damage on NMOS Devices Using Effective Profiles and Device Simulation," pp. IEDM 96–717 thru IEDM 96–720 (K. Vasanth, S. Saxena, V. McNeil, S. List, J. Davis and D. Kapila).

* cited by examiner

Primary Examiner—Long Pham
(74) Attorney, Agent, or Firm—Jacqueline J. Garner; W. James Brady, III; Frederick J. Telecky, Jr.

(57) ABSTRACT

The invention comprises a method of determining the thermal straggle of microelectronic devices having a pocket dopant implant that is formed under substantially the same doping conditions. The method comprises measuring the operating characteristics of each device (32) and obtaining a one-dimensional doping profile of dopant ions in the devices (30). A total lateral straggle of the dopant ions in the devices is determined in response to the operating characteristics and the one-dimensional doping profile of the dopant ions (34). An as-implanted straggle of the dopant ions in the devices is determined in response to the doping conditions (36). A thermal straggle of the dopant ions is calculated utilizing the as-implanted straggle and the total lateral straggle (38).

19 Claims, 3 Drawing Sheets

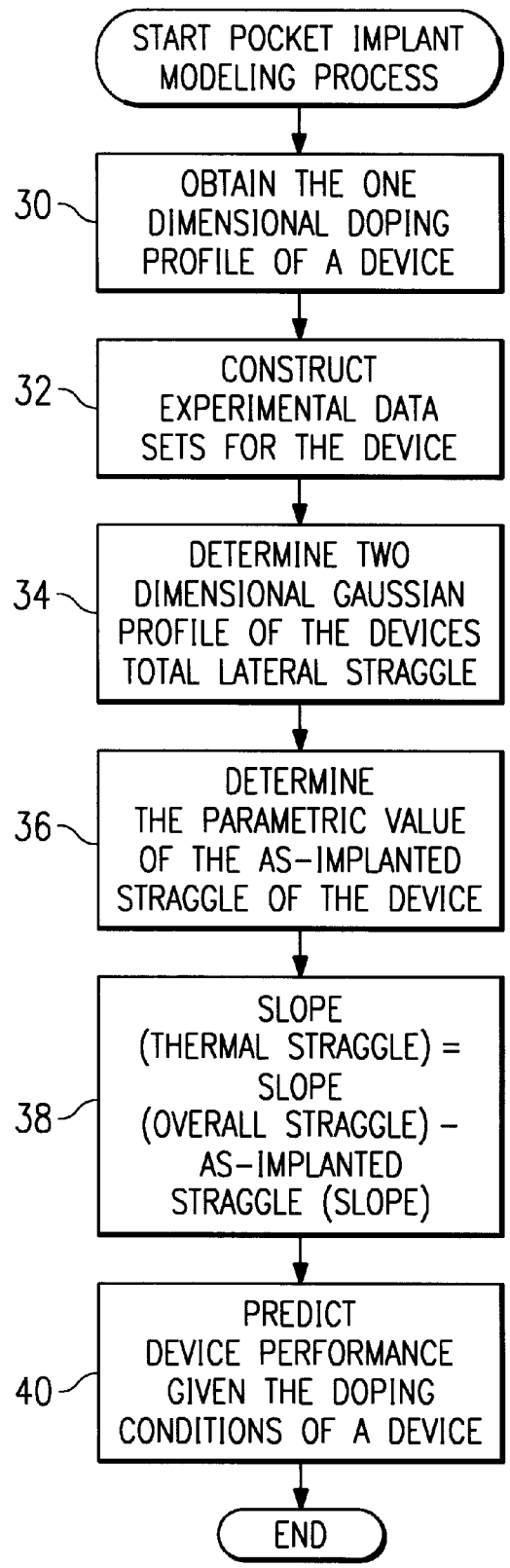

METHOD OF POCKET IMPLANT MODELING FOR A CMOS PROCESS

This application claims priorty under 35 USC §119 (e)(1) of provisional application number 60/068,633, filed Dec. 23, 1997.

TECHNICAL FIELD OF THE INVENTION

The present invention relates to the field of semiconductor processing and more particularly to a method of pocket implant modeling for a CMOS process.

BACKGROUND OF THE INVENTION

The density of microelectronic devices on a semiconductor substrate may be increased by decreasing the size or line width of the microelectronic devices. The decrease in line width allows a large number of microelectronic devices to be formed on a semiconductor substrate. As a result, the competing power and speed of semiconductor component may be greatly improved.

In order to decrease the line width of a microelectronic device, the lateral dimensions of conductor, semiconductor and insulator regions forming each microelectronic device must be reduced. One such region much focused on is the formation of a gate in a CMOS transistor. The gate length of a microelectronic device is one of the most critical areas to address if an increase in the density of microelectronic devices is to be successfully achieved.

One problem associated with decreasing the gate length of CMOS transistors is the ability to create an adequate source and drain region of that transistor by subsequent processing steps as gate lengths continue to shrink. Ideally, the conductive regions comprising a source and drain of a transistor should slightly overlap under a gate body to create a transistor with optimal operating characteristics. CMOS transistors exhibiting optimal overlap can achieve the highest drive current and optimal threshold voltages. Overlap occurs because of the diffusion of dopant ions during and after the formation of the conductive source and drain regions.

As dopant ions are implanted into the surface of a substrate the dopant ions decay or diffuse laterally. Because dopant implantations are traditionally aligned at the edges of a gate body, any lateral diffusion in the direction of the gate creates a region of overlap. The shorter the gate length of the microelectronic device, the more detrimental an unoptimized overlap may be to the performance of the microelectronic device. For example, a minimal overlap compared to the total gate length in a 0.5 micron device becomes significant in a sub 0.25 micron device.

One means of optimizing dopant overlap under the gate body is through the creation of a pocket implant region that is doped utilizing a dopant species that counteracts the dopant species used to create the source and drain regions. The primary purpose of pocket implants is to achieve graded doping in the channel region of a device. This graded doping reduces the short channel effects of the device and reduces drive current sensitivity to changes in gate length, thereby improving device performance. The pocket implant is ideally situated just under the gate edge in the same vertical dimension as the overlap that is to be optimized. The dopant used to create the source and drain regions has a concentration gradient such that the concentration of the implant outside the gate is very high and begins to drop exponentially at the gate edge. The pocket implant is designed to counteract to some degree the small dopant concentration that exists inside the gate edges. Pocket implants have been successfully utilized to obtain high drive currents and otherwise desirable performance characteristics in microelectronic devices by optimizing source and drain dopant overlap. Even in smaller device geometries, such as devices using sub 0.25 micron gate lengths, pocket implants have been successfully utilized.

However, no systematic means currently exists for determining which optimal conditions during pocket dopant implantation best optimize source and drain dopant overlap. Currently, for each newly manufactured semiconductor device, with its own specific doping characteristics, device geometries, and operating conditions, a wide range of implant dosages, energies, and angles of implantation must be attempted to create a pocket implant that successfully optimizes source and drain region gate overlap.

SUMMARY OF THE INVENTION

Accordingly, a need has arisen for a method of pocket implant modeling for a CMOS process that allows a systematic means of selecting the appropriate conditions under which to create an effective pocket implant.

In accordance with the teachings of the present invention, a method of determining the thermal straggle of microelectronic devices having a pocket dopant implant that is formed under substantially the same doping conditions is disclosed that comprises measuring the operating characteristics of each device and obtaining a one-dimensional doping profile of dopant ions in the devices. A total lateral straggle of the dopant ions in the devices is determined in response to the operating characteristics and the one-dimensional doping profile of the dopant ions. An as-implanted straggle of the dopant ions in the devices is determined in response to the doping conditions. A thermal straggle of the dopant ions is calculated utilizing the as-implanted straggle and the total lateral straggle.

The disclosed invention provides several technical advantages. For example, the disclosed invention offers a previously unavailable, easily implemented, simple and effective means of modeling the pocket implant and device performance characteristics. The invention allows the prediction of device operating characteristics based on a particular pocket implant dosage, energy, and implantation angle. The invention also results in substantial savings in silicon wafers previously used to test the operating characteristics of microelectronic devices for different implant dosage conditions. An additional advantage of the invention is that it allows for the more cost effective use of pocket implants in small device geometries. Furthermore, the invention provides a systematic method that can be utilized across a broad spectrum of device technologies to determine the correct dopant implantation conditions to be followed for optimal device performance. Other technical advantages will be readily apparent to one skilled in the art from the following figures, descriptions and claims.

BRIEF DESCRIPTION OF THE DRAWINGS

For a more complete understanding of the present invention and its advantages thereof, reference is now made to the following brief description, taken in conjunction with the accompanying drawings and detailed description, wherein like reference numerals represent like parts, in which:

FIG. 6 is a flowchart of a process for pocket implant modeling for a CMOS process.

DETAILED DESCRIPTION OF THE INVENTION

The preferred embodiments of the present invention and its advantages are best understood by referring now in more detail to FIGS. 1–6 of the drawings, in which like numerals refer to like parts.

Figure 1:
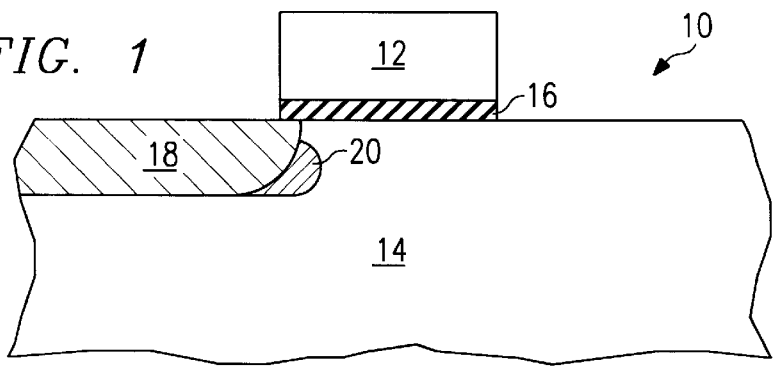
FIG. 1 is a greatly enlarged cross-sectional view of a semiconductor device utilizing a pocket implant.

Referring to FIG. 1, a microelectronic device 10 is shown. Microelectronic device 10 may be an N type or P type device. A gate 12 is disposed outwardly from a substrate 14, and may be separated from the substrate by a gate oxide layer 16. A conductive source or drain region 18 is disposed inwardly from the surface of substrate 14 adjacent to the edge of gate 12.

Conductive source or drain region 18 is formed by implanting a dopant species comprising, for example, arsenic in an N type device. Dopant species may implanted at dose of approximately $1 \times 10^{14}$ per square centimeter, for example, and at an energy of 15 KeV, for example. The dopant species forming source or drain region 18 experiences lateral decay, or straggle, during implantation (as-implanted straggle) and subsequent thermal processes (thermal or diffusion straggle). Straggle is generally defined as the statistical fluctuation of an ion from a projected range or band of ion implantation. This straggle is the cause of source and drain region 18 overlap under the edges of gate 12.

A second dopant species is thereby implanted to form a pocket implant 20 designed to optimize the overlap of region 18 as described above. The second dopant species may comprise boron for an N type device and may be implanted utilizing a range of values for the parameters of implantation angle, dosage and energy. For example, a range of angles from 25 degrees to 65 degrees may be utilized as an implantation angle. A range of $1 \times 10^{12}$ per square centimeter to $1 \times 10^{13}$ per square centimeter may be utilized for boron dosage. Finally, a range of energies for the implantation may be used from 10 to 25 KeV, for example. Pocket implant 20 has its own decay or straggle comprised of an as-implanted straggle value occurring during implantation and a thermal straggle component that occurs during thermal processes.

Initial experimentation is performed on the microelectronic device to obtain electrical performance data across a range of pocket implant dopant implantation conditions such as those described above. For example, performance data can be obtained at several data points wherein the dopant species is implanted at a varied energy, dosage, and angle. The performance data for the device between data points can be achieved through well known interpolation techniques.

Figure 2:
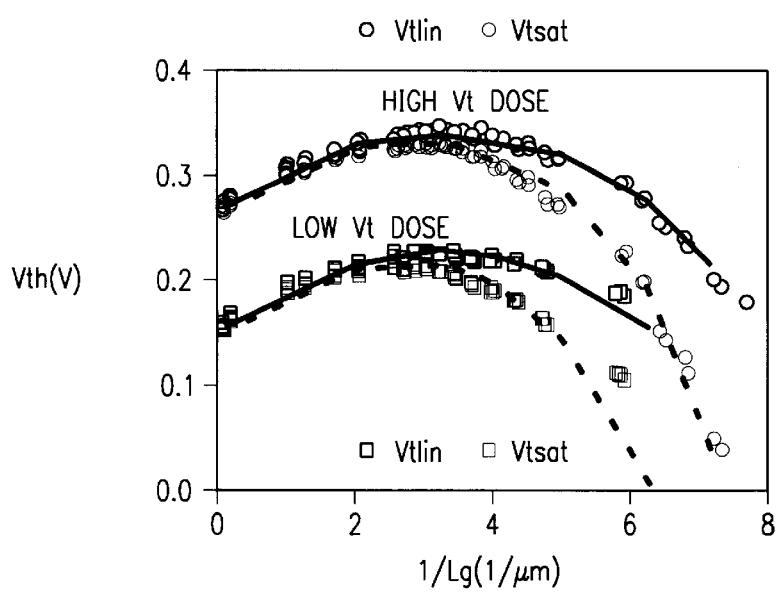
FIGS. 2–5 are diagrams of experimental and theoretical operating characteristics of a microelectronic device at different conditions.

One important experimental performance value is the threshold voltage of device 10. The device voltage for a particular set of doping parameters may be determined, for example, by connecting the drain to a supply voltage and the measuring the drain current as a function of the gate voltage. A threshold voltage may be experimentally measured for a range of device gate lengths all contained on one wafer. Thus, an experimental threshold voltage as a function of gate length can be expressed as a curve for a particular dose of implant as shown in FIG. 2 for an NMOS device utilizing a boron dopant species for a pocket implant.

Figure 3:
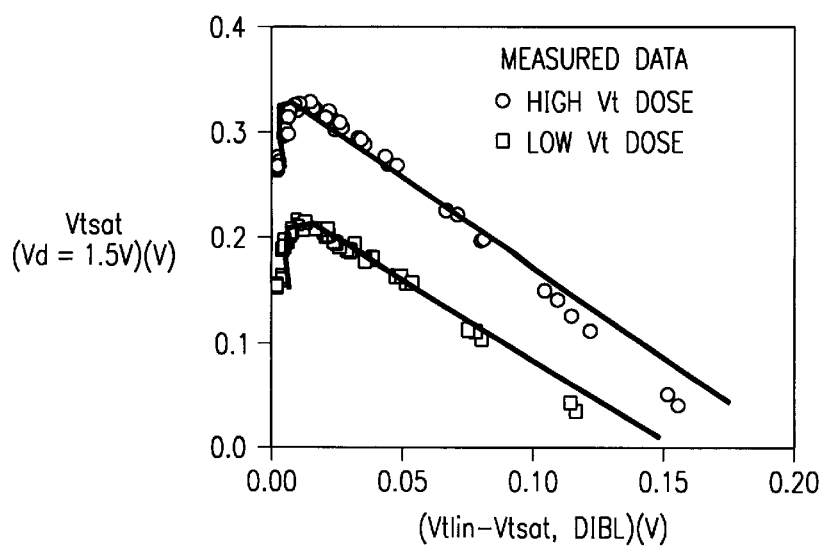
Figure 4:
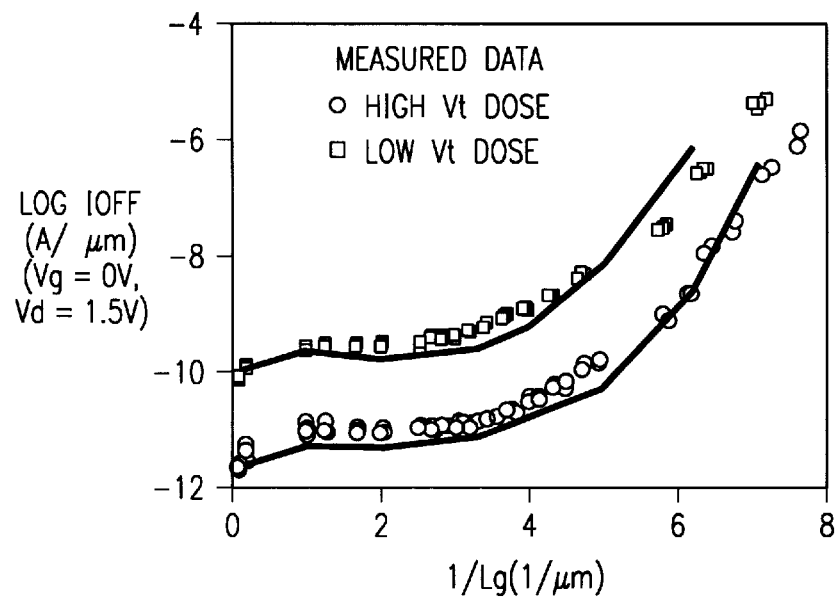
Figure 5:
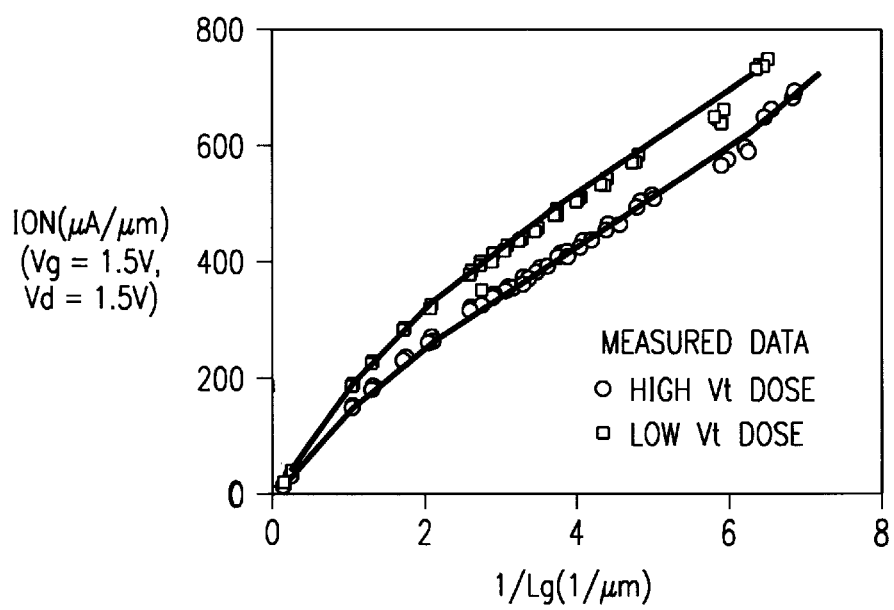

Similarly, threshold voltage values for the NMOS device may be measured when the device is operating at saturation and when the device is operating linearly. As shown in FIG. 3, the threshold voltage at saturation can be expressed as a function of the difference in threshold voltage during linear performance and when the device is at saturation. Other meaningful device parameters can also be experimentally measured. An off current experimentally obtained is shown as a function of device gate length in FIG. 4. An experimental drive current is similarly expressed as a function of gate length in FIG. 5.

Referring now to FIG. 6, an exemplary process for pocket implant modeling in CMOS processing is shown that utilizes the experimental data described above. First, a one dimensional doping profile of the pocket dopant species for the devices experimentally tested is obtained in step 30. The doping profile can be obtained utilizing a secondary ion mass spectroscopy (SIMS) device well known in the industry or from one dimensional process simulation.

The one dimensional doping profile of the microelectronic device consists of the doping concentration being expressed as a function of depth from the surface of the substrate. The doping profile begins at a depth of zero and charts the concentration of the boron dopant implanted to form the pocket implant as depth increases. The doping profile is expressed as a logarithmic function of depth for a specific set of implantation conditions including a dosage, energy, and angle of implantation.

It should be noted that the SIMS device only measures the concentration gradient of the pocket implant as a function of depth outside the edges of the gate of a device. This is primarily due to the fact that the SIMS device measures one dimensional dopant concentration over a relatively wide lateral distance of approximately 10 microns.

Next, in step 32, experimental data sets are constructed for all electrical performance data collected from a device utilizing specific pocket implantation conditions. For example, the performance data for a device utilizing a specific implantation conditions includes performance data measured or interpolated at a range of gate lengths.

These data sets and the one dimensional pocket doping profiles associated with them are then utilized in step 34 to theoretically determine a parametric two-dimensional gaussian profile of the total lateral straggle of an implant. The estimated profile must result in a theoretical device performance data that matches the electronic performance data collected experimentally from an actual devices as described above. The total lateral straggle is determined using known relationships between the threshold voltage of an electronic device and the parametric curve representing the total lateral straggle. More specifically, the threshold voltage of a device is a function of the open equation:

$$V_T = f(e^{(-x/\sigma^2)}) \tag{1}$$

In the above equation, σ is the parametric value of the total lateral straggle of the dopant used to form a pocket implant.

To determine the parametric value of the total lateral straggle of a device, the threshold voltage and gate length of the experimental devices, all utilizing the same pocket implant doping conditions, are entered into any two-dimensional device simulator such as the MEDICI simulator manufactured by Technology Modeling Associates of Sunnyville, Calif., for example. The two dimensional device simulator iteratively targets, substitutes, and refines values of σ, or total lateral straggle, until the theoretical threshold voltage for a particular value of σ matches the actual experimental threshold voltage value.

This process of iteration can be thought of as altering the value of σ until a threshold voltage curve as a function of gate length for that particular σ value matches the experimental threshold voltage curve of FIG. 2 for a particular device. Once the theoretical voltage curve matches the experimental curve, the correct parametric value of your total lateral straggle has been obtained for a particular set of implant conditions. The parametric value of the total lateral straggle may be expressed as a curve where dopant concentration is a logarithmic function of the lateral distance under a device gate.

After a theoretical value for total lateral straggle has been obtained from the two dimensional simulator in. step 34, a monte carlo ion implantation package, such as the UT Marlowe System manufactured by the University of Texas at Austin, may be utilized in step 36 to obtain the parametric value of the as-implanted straggle component of the final straggle. The monte carlo ion implantation package traces the path of every atom of an implanted species through the silicon lattice of a substrate. The monte carlo ion implantation package utilizes monte carlo ion implanting and is capable of theoretically charting the path of a dopant atom and the atom's final ending position after implantation is complete.

The monte carlo ion implantation package, unlike the SIMS device, is capable of charting a path of doping agents that penetrate beneath the gate edge of a device. This device simulator can therefore chart the path of an angled implant. Since the monte carlo ion implantation package is capable of charting the path of individual atoms, it is also capable of calculating the variance of those atoms from the intended implant range. This variance allows the monte carlo ion implantation package to thereby obtain the as-implanted straggle of a dopant implantation in a particular microelectronic device given the device geometries and dopant implantation conditions.

The monte carlo ion implantation package can be utilized to obtain a range of values for as-implanted straggle at specific dosage, energy, and angle of implantation for doping agents implanted to form conductive source and drain regions and pocket implant. The Monte carlo ion implantation package utilizes crystal orientation, electron stopping energies, nuclear stopping energies, and the above-listed doping characteristics to obtain a value for as-implanted straggle for a theoretical electronic device. As a result, the monte carlo ion implantation package can be utilized to create a look up table of extensive data presenting the as-implanted straggle across a wide range of implantation angles, dosages, and energies for a given device.

Having obtained a parametric value for the final straggle from a device simulator and a parametric value for as-implanted straggle from the monte carlo ion implantation package for a particular device and particular implantation conditions, the thermal straggle parametric value for a particular implant dosage in a particular device may be calculated in step 38 by subtracting the slope of the as-implanted straggle logarithmic curve for a particular implantation energy from the slope of the overall straggle logarithmic curve at that energy.

The thermal straggle value, expressing dopant concentration as a parametric function of distance under the gate edge as described above, can now be utilized in step 40 as part of a data set useful to predict device performance and operating characteristics given particular implant conditions. Because the thermal or diffusion straggle is constant for a particular implant species as long as thermal procedures, such as annealing, remain constant, the thermal straggle value can be used with interpolated values from the Marlowe system for a given implantation angle, implant energy, and implant dose to determine an as-implanted straggle. Using the thermal straggle and the as-implanted straggle a two-dimensional doping profile can be constructed. The two-dimensional doping profile can in turn be used to obtain device performance characteristics across a wide range of dopant parameters.

Specifically, to obtain the threshold voltage of a device for a given energy, dose, and angle of implantation creating a pocket implant, the UT Marlowe data can be examined to obtain a parametric value for as-implanted straggle. This value for as-implanted straggle can then be added to the constant thermal straggle value of a device to obtain a parametric value for total lateral straggle. Using the parametric value of the total lateral straggle, the two-dimensional device simulator can again be utilized to determine predicted theoretical values for threshold voltage, off current and drive current for a microelectronic device for the given pocket implant conditions.

Additionally, using the total lateral straggle value obtained using the techniques described in step 34, a look-up table may be constructed that can later be used to test device characteristics. For example, where a change in gate length, gate oxide thickness or other device parameters that do not affect lateral straggle is desired, the total lateral straggle value may be used to predict device performance.

Although the present invention has been described with several embodiments, various changes and modifications may be suggested to one skilled in the art. For example, the systematic methodology of obtaining straggle values of the disclosed invention may be extended to other CMOS technology nodes. It is intended that the present invention encompass such changes and modifications as fall within the scope of the present appended claims.

What is claimed is:

1. A method of determining the thermal straggle of microelectronic devices having a pocket dopant implant of dopant ions and formed under substantially the same doping conditions, comprising the steps of:

measuring operating characteristics of the devices;

obtaining a one-dimensional doping profile of the dopant ions in the devices;

determining a total lateral straggle of the dopant ions in the devices in response to the operating characteristics and the one-dimensional doping profile of the dopant ions;

determining an as-implanted straggle of the dopant ions in the devices in response to the doping conditions; and calculating a thermal straggle of the dopant ions utilizing the as-implanted straggle and the total lateral straggle.

2. The method of claim 1, further comprising the steps of:

determining a theoretical as-implanted straggle of theoretical dopant ions in a theoretical device having a pocket implant in response to theoretical doping conditions;

calculating a theoretical total lateral straggle of the theoretical dopant ions in response to the thermal straggle and the theoretical as-implanted straggle; and predicting theoretical operating characteristics of the theoretical device in response to the theoretical total lateral straggle.

3. The method of claim 1, wherein the step of obtaining a one-dimensional doping profile further comprises utilizing a ion mass spectroscopy device.

4. The method of claim 1, wherein the step of determining a total lateral straggle further comprises utilizing a two-dimensional device simulator.

5. The method of claim 1, wherein the step of determining an as-implanted straggle further comprises utilizing a monte carlo ion implantation package.

6. The method of claim 1, wherein the step of measuring the operating characteristics further comprises measuring the threshold voltage of each device.

7. The method of claim 1, wherein the step of determining an as-implanted straggle further comprises tracing the paths of dopant ions in response to implantation angle, dopant ion energy, and dopant ion dosage.

8. A method of determining operating characteristics of a theoretical microelectronic device having a pocket implant of dopantions, comprising the steps of:

measuring experimental operating characteristics of experimental devices each having a pocket implant doped under substantially the same doping conditions;

obtaining a one-dimensional doping profile of the dopant ions in the experimental devices;

determining an experimental total lateral straggle of the dopant ions in response to the experimental operating characteristics and the one-dimensional doping profile;

determining an experimental as-implanted straggle of the dopant ions in the experimental devices in response to the doping conditions;

calculating an experimental thermal straggle of the dopant ions in response to the experimental as-implanted straggle and the experimental total lateral straggle;

determining a theoretical as-implanted straggle of theoretical dopant ions in the theoretical device in response to theoretical doping conditions;

calculating a theoretical total lateral straggle of the theoretical dopant ions utilizing the experimental thermal straggle and the theoretical as-implanted straggle; and predicting the theoretical operating characteristics of the theoretical device in response to the theoretical total lateral straggle.

9. The method of claim 8, wherein the step of obtaining a one-dimensional doping profile further comprises utilizing a ion mass spectroscopy device.

10. The method of claim 8, wherein the step of determining an experimental total lateral straggle further comprises utilizing a two-dimensional device simulator.

11. The method of claim 8, wherein the step of determining an experimental as-implanted straggle further comprises utilizing a monte carlo ion implantation package.

12. The method of claim 8, wherein the step of calculating an experimental thermal straggle further comprises the step of subtracting the experimental as-implanted straggle from the experimental total lateral straggle.

13. The method of claim 8, wherein the step of measuring experimental operating characteristics further comprises measuring the threshold voltage of each device.

14. The method of claim 8, wherein the step of determining an experimental as-implanted, straggle further comprises tracing the paths of dopant ions in response to an implantation angle, a dopant ion energy, and a dopant ion dosage.

15. A method of determining operating characteristics of a theoretical microelectronic device having a pocket implant, comprising the steps of:

measuring experimental operating characteristics of experimental devices having a pocket implant doped under a substantially the same experimental implantation angle, experimental dopant ion energy, and experimental dopant ion energy;

obtaining a one-dimensional doping profile of dopant ions in the experimental devices by utilizing a ion mass spectroscopy device;

determining an experimental total lateral straggle of the dopant ions in the experimental devices in response to the experimental operating characteristics and the one-dimensional doping profile;

determining an experimental as-implanted straggle in response to the experimental implantation angle, the experimental dopant ion energy, and the experimental dopant ion dosage;

calculating an experimental thermal straggle by subtracting the experimental as-implanted straggle from the experimental total lateral straggle;

determining a theoretical as-implanted straggle of theoretical dopant ions in the theoretical device in response to theoretical doping conditions;

calculating a theoretical total lateral straggle of theoretical dopant ions utilizing the experimental thermal straggle and the theoretical as-implanted straggle; and predicting the theoretical operating characteristics of the theoretical device in response to the theoretical total lateral straggle.

16. The method of claim 15, wherein the step of determining a theoretical as-implanted straggle further comprises tracing the path of dopant ions in response to a theoretical implantation angle, a theoretical dopant ion energy, and a theoretical dopant ion dosage.

17. The method of claim 15, wherein the step of calculating a theoretical total lateral straggle further comprises the step of adding the experimental thermal straggle to the theoretical as-implanted straggle.

18. The method of claim 15, wherein the step of determining a theoretical as-implanted straggle further comprises utilizing a monte carlo ion implantation package.

19. The method of claim 15, wherein the step of predicting the theoretical operating characteristics further comprises utilizing a two-dimensional device simulator.

* * * * *